June 10, 1969 J. H. SCOTT, JR., ET AL 3,449,647

REMOTE CUTOFF JUNCTION GATE FIELD EFFECT TRANSISTOR

Filed Jan. 16. 1967

INVENTORS:
JOHN A. OLMSTEAD &
JOSEPH H. SCOTT, JR.

BY

Attorney

June 10, 1969 J. H. SCOTT, JR., ET AL 3,449,647
REMOTE CUTOFF JUNCTION GATE FIELD EFFECT TRANSISTOR
Filed Jan. 16. 1967 Sheet 2 of 2

Inventors:
JOHN A OLMSTEAD &
JOSEPH H. SCOTT, JR.
BY
Attorney

United States Patent Office 3,449,647

Patented June 10, 1969

3,449,647

REMOTE CUTOFF JUNCTION GATE FIELD EFFECT TRANSISTOR

Joseph H. Scott, Jr., Newark, and John A. Olmstead, Somerville, N.J., assignors to Radio Corporation of America, a corporation of Delaware Filed Jan. 16, 1967, Ser. No. 609,425
Int. Cl. H01l *13/00*
U.S. Cl. 317—235 1 Claim

ABSTRACT OF THE DISCLOSURE

A junction-gate field effect transistor with a remote-cutoff transfer characteristic.

The transistor has a pair of opposed gates, the spacing between which varies transversely of the direction of current flow to provide differing values of pinch-off voltage laterally along the gates.

*Background of the invention*

This invention relates to junction-gate field effect transistors. Transistors of this type comprise generally a channel region of semiconductive material of one conductivity type, a source and a drain ohmically connected to the channel and a gate region of conductivity type opposite to that of the channel region providing a rectifying junction for controlling the conductivity of the channel. Such devices are used as active elements in electronic circuits such as amplifying, switching, or oscillating circuits.

An important feature of the present device is its transfer characteristic which is a plot of the transconductance, $g_m$, of the device as a function of the applied gate voltage, $V_G$. The transfer characteristic is directly related to the power gain of the device through the relation $$\text{Power gain} = g_m^2 R_{in} R_{out}$$

where $R_{in}$ is the input impedance and $R_{out}$ is the output impedance. The transconductance $g_m$ is defined as the ratio of the differential change of drain current through the channel, $\partial I_D$, to the differential change of gate voltage $\partial V_G$ at constant drain voltage $V_D$. The pinch-off voltage of the device, $V_{po}$, is the gate voltage at which the drain current approaches zero.

Most previous junction-gate field effect transistors exhibit a transfer characteristic with sharp cutoff. By sharp cutoff is meant that the transconductance drops sharply as the gate voltage changes in the proper sense to reduce the drain current. A transfer characteristic with a sharp cutoff is desirable in some applications, such as switching circuits; however, in other applications, such as automatic gain controlled amplifying circuits, a more desirable transfer characteristic is one having a remote cutoff. Ideally, a transfer characteristic having a remote cutoff is asymptotic to the value $g_m=0$ and the gate voltage never completely pinches off the drain current. In practice, this is only approximated.

The previous junction-gate field effect transistor disclosed in U.S. Patent 2,951,191 to G. B. Herzog has structure which can provide a remote cutoff characteristic. In the Herzog device, a channel having a cross sectional area which varies transversely to the direction of current flow is provided by cutting or etching a groove in a body of semiconductor material, the base or bottom of the groove having a spacing which varies in predeterminer manner from the control junction of the device. It is difficult, however, to cut or etch a groove of the small width usually required in these devices.

*Summary of the invention*

One object of this invention is to provide a novel junction-gate field effect transistor having a remote cutoff transconductance characteristic.

Another object of the invention is to provide a novel junction-gate field effect transistor which is particularly useful in gain-controlled amplifying circuits.

Still another object of the invention is to provide a field effect transistor in accordance with the foregoing objects which has improved high frequency and low noise performance.

In general, the present field effect transistor comprises a body of semiconductive material having source and drain ohmic contacts defining the ends of a semiconductive channel containing a plurality of electrically parallel current paths of controllable conductivity therethrough and gate junctions disposed on respective opposite sides of the current paths. The transistor has a remote cutoff transconductance characteristic by having structure which provides differing values of pinch-off voltage laterally along the gate junctions. The lateral direction as used herein is the direction along the gate junctions transverse to the directions of the drain current paths.

The differing pinch-off voltages are provided by means of a lateral variation or difference in a characteristic of the channel, such as the spacing between the opposed gate junctions. This variation in spacing may be discontinuous, that is, it may vary in step-like fashion, or it may be continuous, with the junctions being mutually non-parallel. In any case, the device may be thought of as a plurality of individual devices connected together in parallel, some of the devices having relatively high transconductance and relatively low cutoff voltages and others having low transconductance and high cutoff voltages, the characteristic of the device as a whole being a composite of these individual characteristics.

*The drawings*

*Preferred embodiments*

Figures 1, 2, 3, 4, 5, 8:
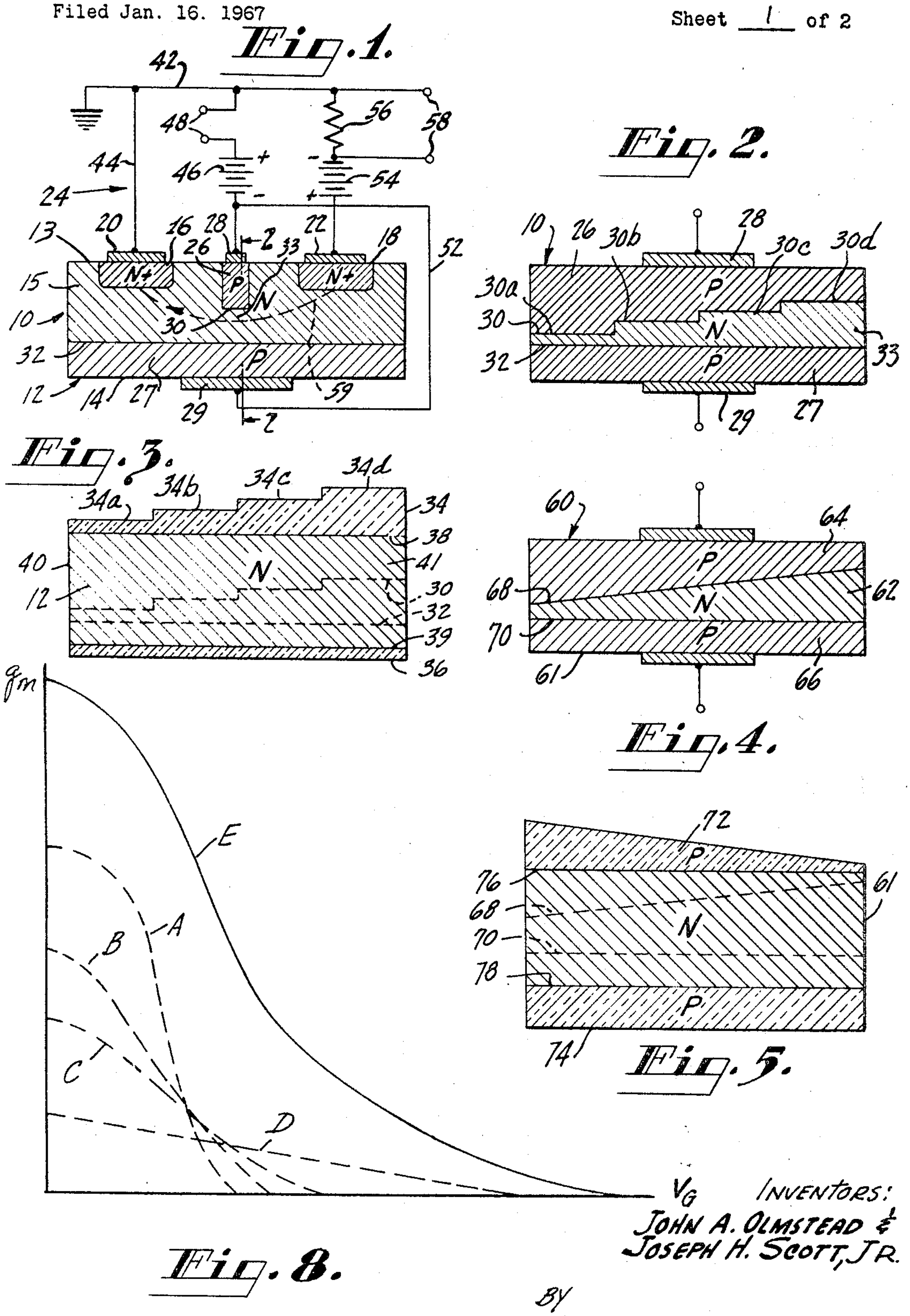
FIGURE 1 is a cross-section taken parallel to the direction of the current flow through one embodiment of the present device, together with a typical operating circuit therefor.
FIGURE 2 is a cross-section on the line 2—2 of FIGURE 1, showing a discontinuous variation in the gate spacing.
FIGURE 3 is a cross-section illustrating a method of making the device of FIGURE 2.
FIGURE 4 is a cross-section similar to FIGURE 2 through another embodiment of this device, showing a continuous variation in gate spacing.
FIGURE 5 is a cross-section illustrating a method of making the device of FIGURE 4.
FIGURE 8 is a plot of transconductance vs. gate voltage, illustrating the remote cutoff characteristic of any of the embodiments of the present device.

One embodiment of the present device is generally indicated by numeral 10 in FIGURES 1 and 2. The device 10 is fabricated from a body 12 of semiconductive material. The size and shape of the body 12 are not critical, but, for illustrative purposes, the body 12 has been shown in FIGURE 1 as having a rectangular cross section with respective upper and lower major surfaces 13 and 14. The portion of the body 12 adjacent to its upper surface 13 consists of a channel region 15, the conductivity of which in this example is N type. A suitable starting material for the body 12 is silicon, containing phosphorus as a doping impurity to provide the N type conductivity in the region 15. Two regions 16 and 18 of higher conductivity (N+) but of the same conductivity type as the region 15 are provided at respective spaced locations adjacent to the upper surface 13 of body 12 to aid in making ohmic contact to the region 15. The regions 16 and 18 may be formed by diffusing additional impurities into the body 12 at the desired locations, for example.

The regions 16 and 18 constitute the source and drain regions of the device 10 and define the terminals of current flow through the region 15. For a clear understanding of the operation of the present device, it is advantageous to consider the regions 16 and 18 as defining the ends of a plurality of individual charge carrier paths through the region 15. Metallic electrodes 20 and 22 are attached to the surface 13 in contact with the regions 16 and 18 to connect the regions 16 and 18 to an external circuit 24, the details of which will be described hereinafter.

The body 12 also includes two regions 26 and 27 of conductivity type opposite to that of the channel region 15 and constituting the control or gate regions of the device. The region 26 is adjacent to the upper surface 13 of the body 12 at a location between the regions 16 and 18 and is of limited width. The region 27 is adjacent the lower surface 14 of the body 12 and, in this example, extends adjacent to the surface 14 across the entire width of the body 12. Metallic electrodes 28 and 29 are disposed on the surfaces 13 and 14 in contact with the regions 26 and 27 respectively to connect these regions to external circuitry.

Rectifying junctions 30 and 32 are formed by the channel region 15 and the gate regions 26 and 27. The junctions 30 and 32 define the opposite sides of an active channel portion 33 of the channel region 15, the aforementioned charge carrier paths passing through the channel portion 33. When the junctions 30 and 32 are reversed biased, the depletion regions associated therewith will extend into the channel region 33 so as to vary the effective cross sectional area, and, consequently, the conductivity thereof.

As is generally known in the art, the frequency response of field-effect devices of this kind is a function of the transit time of majority carriers in the active or controlled portion of the channel, and this, in turn, is a function of the length of the channel. For good high frequency operation, a short channel is therefore required. In the device of FIGURE 1, the length of the active channel is the length of the channel portion 33 as defined by the width of the gate region 26. This dimension is typically of the order of 0.2 mil.

The physical shape of the junctions 30 and 32 transverse to the general direction of current flow between the regions 16 and 18 provides the remote cutoff characteristic of the device 10. With reference to FIGURE 2, it will be observed that the junction 32 is substantially flat along the entire width of the device 10 whereas the junction 30 has a step-like configuration, that is, junction 30 has portions 30*a*, 30*b*, 30*c*, and 30*d* which are at different spacings from the junction 32. Because of these different spacings, a reverse bias voltage which is just high enough to pinch off the portion of the active channel portion 33 between junctions 30*a* and 32, for example, will not be sufficient to pinch off the remaining portions of the channel. Similarly, a higher voltage which is sufficient to pinch off the conduction between junctions 30*b* and 32 will also pinch off conduction between junctions 30*a* and 32 but will not be sufficient to pinch off the conduction between junctions 32 and junctions 30*c* and 30*d* and so forth. The junction 32 may be stepped also, as long as different spacings are maintained along the junctions.

FIGURE 3 is a cross section illustrating one method of achieving the different spacings of the junctions. In FIGURE 3, a body 12 of material which has the conductivity type of the channel region 15 throughout its volume is shown with coatings 34 and 36 on its major surfaces 38 and 39. The coatings 34 and 36 may be of deposited silicon oxide, for example, and act as means for retarding the diffusion of certain impurities into the body 12 from the surrounding ambient. In this example, it is assumed that the other major surfaces of body 12, such as the surfaces 40 and 41 in FIGURE 3, are not exposed to the diffusing ambient. For example, the surfaces 40 and 41 may be coated with a material, not shown, which is relatively impermeable to the diffusing impurities.

As shown, the coating 36 is of uniform thickness while the coating 34 is stepped, having portions 34*a*, 34*b*, 34*c*, and 34*d* which correspond to the step portions of the junction 30. When the body 12 is immersed in a gaseous atmosphere containing suitable doping impurities, these impurities will diffuse through the coatings 34 and 36 and into the body 12. Because the coating 36 is of uniform thickness, the diffusion of impurities through it will be uniform and junction 32 will thus be formed substantially parallel to the surface 39. The thicker portions of layer 34 will retard the diffusion of the doping impurities to a greater extent at the righthand portion of the device than the thinner portions at the lefthand portion thereof. Thus, for a given time period of diffusion, impurities will penetrate the body 12 to a greater distance below the left end of the major surface 38 than below the right end thereof. Portions 30*a*, 30*b*, 30*c*, and 30*d* of junctions 30 will thereby be formed substantially parallel to and uniformly spaced from each corresponding portion 34*a*, 34*b*, 34*c* and 34*d* of layer 34.

Circuit 24 (FIGURE 1) is a typical amplifying circuit in which device 10 may be used. Circuit 24 includes a ground lead or bus 42. A source lead 44 connects the contact 20 of device 10 directly to the ground lead 42. A gate circuit, comprising a gate biasing battery 46 in series with a pair of input terminals 48, is connected between the ground lead 42 and the gate contacts 28 and 29 by means of gate leads 50 and 52. A drain circuit, comprising a drain biasing battery 54 in series with a load resistor 56, is connected between the ground lead 42 and the contact 22. The output of the device is taken across the load resistor 56 on terminals 58.

The polarities of the batteries 46 and 54 are such that the junctions 30 and 32 are reverse biased. A signal applied to the contacts 48 will vary the width of the depletion regions associated with the junctions 30 and 32 so that the conducting area of the channel portion 33 will follow the variations in the input signal. Current through the device and the output signal at terminals 58 will be varied correspondingly. When the device is operated, current flow is from ground through the load resistor 56 and the battery 54 to contact 22 and the associated region 18 and then into the conductive channel region 15 of the body 12. From the region 18, current flows through the channel portion 33 between the junctions 30 and 32 to the region 16, as suggested by the dashed line 59, and from there to the contact 20 and back to ground over the lead 44. The circuit 24 may be used to operate any of the embodiments of the invention described herein.

FIGURE 4 illustrates another form of the present device, designated generally by numeral 60. In the direction parallel to the direction of current flow, device 60 will have a cross section essentially the same as that of the device 10.

The device 60 comprises a body 61 of semiconductive material, which may be the same material as that used for the body 12 of the embodiment of FIGURE 1. The body 61 includes a central channel region 62 of one conductivity type and a pair of opposed gate regions 64 and 66, on respective opposite sides of the channel region 62, these elements corresponding to the active channel portion 33 and the gate regions 26 and 27 respectively of the embodiment of FIGURE 1. The gate regions 64 and 66 define junctions 68 and 70 on respective opposite sides of the channel portion 62 of the body 61.

In this embodiment, there is again a variation in spacing between the gate junctions of the device, the variation being continuous here. Thus, as shown, each of the junctions 68 and 70 is substantially flat through its length but the junctions are mutually non-parallel.

FIGURE 5 illustrates a method of making the device of FIGURE 4. Here, a body 61 of uniformly N type silicon, for example, is provided with coatings 72 and 74 on its major surfaces 76 and 78. In this case, the coatings 72 and 74 are deposited silicon oxide coatings containing P type doping impurities within them. The coating 74 is of uniform thickness and the coating 72 is of tapered thickness, as shown. When the device is heated, doping impurities will diffuse from the coatings 72 and 74 into the body 61. Because of the shape of the coating 72, more doping impurity atoms will be available at the left side of the device as seen in FIGURE 5 than at the right side thereof. Therefore, diffusion will take place to a greater depth at the left side of the figure than at the right so that junction 68 will be formed effectively as a mirror image of coating 72. It will be understood that the device of FIGURE 2 may also be made by means of the doped oxide process just described, and, alternatively, the device 60 may be made by the inhibiting mask process described in connection with FIGURE 3.

Figure 6:
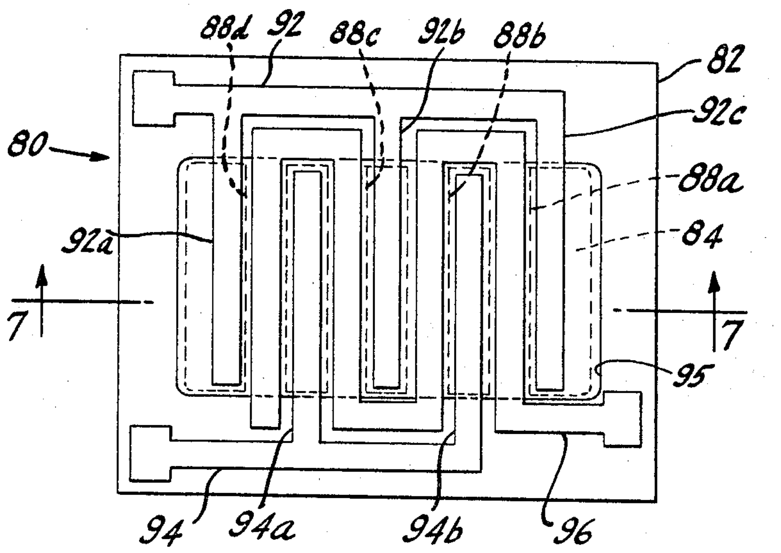
FIGURE 6 is a plan view of still another embodiment of the present device.
Figure 7:
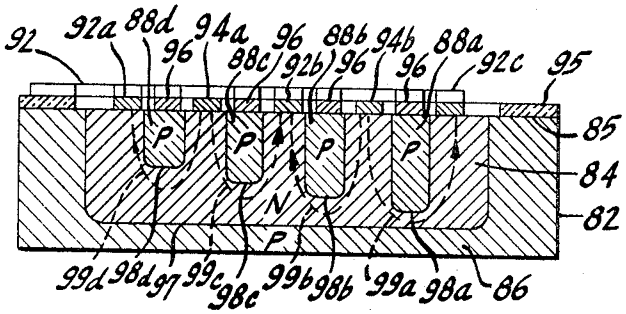
FIGURE 7 is a cross-section through the embodiment of FIGURE 6, taken parallel to the direction of current flow on line 7—7 of FIGURE 6.

A third embodiment of the present invention is illustrated at 80 in FIGURES 6 and 7. The device 80 employs the interdigitated or maze geometry which is commonly used in this art to increase the width of an active channel.

The device 80 comprises a body 82 of semiconductive material which, in this example, is initially of P type conductivity. As with the previous examples, the size and shape of body 82 are not critical. An N type channel region 84 is provided adjacent to the upper surface 85 of the body 82 by diffusing into the body 82 a quantity of donor impurities sufficient to change the conductivity type of the body 82 in region 84. The balance of the body 82 comprises a gate region 86. Additional gate regions 88*a*, 88*b*, 88*c* and 88*d* are formed within the channel region 84 at spaced locations adjacent to the surface 85 by the diffusion of P type impurities through the surface 85 at the desired locations. Regions 88*a* to 88*d* are diffused to different depths by either of the methods described above.

Because of the spacing between adjacent ones of the regions 88*a* to 88*d*, the channel region 84 has several portions thereof exposed on the surface 85 at locations on opposite sides of each of the regions 88*a* to 88*d*. Ohmic contact is made to each of these portions by means of metal layers 92 and 94 deposited on the surface 85. An insulating coating 95 on the surface 85 serves to isolate the layers 92 and 94 from the body 82 at all other locations. The geometrical configuration of the metal layers 92 and 94 is such that they each have a plurality of fingers 92*a*, 92*b*, 92*c*, and 94*a* and 94*b* respectively, as shown in FIGURE 6, these fingers being connected together electrically by the remaining portions of the layers.

A layer of metal 96 connects each of the regions 88*a*, 88*b*, 88*c* and 88*d* together by extending through the space between the layers 92 and 94, as shown. Each of metal layers 92, 94 and 96 may be connected to external circuitry in known manner.

As shown in FIGURE 7, the gate region 86 defines a junction 97 which is substantially flat below the gate regions 88*a* through 88*d*. Regions 88*a* to 88*d* define junctions 98*a* to 98*d* respectively which are at different spacings from the junction 97. As in the other embodiments, the device 80 can be thought of as being a plurality of devices connected in parallel; and, like the other embodiments, the device 80 has gates which are at different spacings transversely of the direction of current flow. The individual current paths in the device 80 are suggested by the dashed lines 99*a*, 99*b*, 99*c*, and 99*d* in FIGURE 7, the direction of current flow being indicated by the arrowheads on these lines. In operation, device 80 will act in much the same way as does device 10, that is, a gate voltage which is just sufficient to pinch off the channel region between the junctions 98*a* and 97 will not be sufficient to pinch off the conduction between the remaining gates, and so forth.

As has been stated, each of the three embodiments of the present invention operates as if it were a plurality of individual devices connected together electrically in parallel. FIGURE 8 illustrates in dotted lines the gate characteristics of several of the individual portions of a device in accordance with any of these embodiments, together with the composite characteristic of the device as a whole, drawn as a solid line. Thus, FIGURE 8 includes one curve A which represents the characteristic of high gain and low cutoff voltage. Curve A is represenative of the characteristic of the most closely spaced gate portions of device 10 or device 60 or of the portion of the device 80 defined by junctions 97 and 98*a*.

FIGURE 8 also includes a curve D which represents the characteristic of the most widely spaced gate portions of each of the three embodiments. As illustrated by curve D, these portions of the three embodiments exhibit relatively low gain and high cutoff voltages.

Curves B and C in FIGURE 8 are representative of the characteristics of the intermediate portions of each of three embodiments. Thus, they illustrate gain and cutoff characteristics intermediate between the extremes of curves A and D. Finally, curve E is the composite characteristic of the present invention, exhibiting high gain as well as remote cutoff.

What is claimed is:

1. A semiconductive device comprising:
a body of semiconductive material having a pair of opposed major surfaces,
a channel region of one type conductivity in said body, said channel region containing a plurality of electrically parallel charge carrier paths, portions of said channel region being exposed on one of said surfaces,
a plurality of contact means ohmically connected to the exposed portions of said channel and defining the ends of said charge carrier paths, alternate ones of said contact means being connected together electrically, and
means defining spaced rectifying control junctions on opposite sides of said charge carrier paths, the spacing between said junctions differing in the lateral direction along said junctions whereby different pinch-off voltages are required for different ones of said paths, said control junction defining means comprising a first gate region of conductivity type opposite to that of said channel region adjacent to the other of said surfaces and a plurality of second gate regions of said opposite conductivity type adjacent to said one surface and each lying between an adjacent pair of contact means, the periphery of at least one of said second gate regions being closer to said first gate region than the periphery of another of said second gate regions is to said first gate region, said second gate regions being connected together electrically.

References Cited

UNITED STATES PATENTS

| | | | |
|---|---|---|---|
| 2,951,191 | 8/1960 | Herzog | 317—235 |
| 2,989,713 | 6/1961 | Warner | 338—20 |
| 3,335,342 | 8/1967 | Leistiko | 317—235 |
| 3,358,195 | 12/1967 | Onodera | 317—234 |

JAMES W. LAWRENCE, *Primary Examiner.*

J. R. SHEWMAKER, *Assistant Examiner.*